United States Patent

Belasco et al.

[15] 3,700,980

[45] Oct. 24, 1972

[54] SCHOTTKY BARRIER PHOTOTRANSISTOR

[72] Inventors: Melvin Belasco, Dallas; Sebastian R. Borrello, Richardson, both of Tex.

[73] Assignee: Texas Instruments Incorporated, Dallas, Tex.

[22] Filed: April 8, 1971

[21] Appl. No.: 132,368

Related U.S. Application Data

[63] Continuation of Ser. No. 652,653, July 5, 1967, abandoned.

[52] U.S. Cl. ....317/235 R, 317/235 N, 317/235 UA, 317/235 Y, 117/200, 117/212

[51] Int. Cl. ....H01l 15/00

[58] Field of Search ........317/235 N, 235 UA, 235 Y

[56] References Cited

UNITED STATES PATENTS 3,448,349 6/1969 Sunyner....................317/234

3,222,530 12/1965 Kolhammer..............250/211

*Primary Examiner*—Martin H. Edlow
*Attorney*—Michael A. Sileo

[57] ABSTRACT

Disclosed is a metal-semiconductor-metal phototransistor formed by a pair of closely spaced, thin metal films in rectifying contact with the surface of a lightly doped p-type indium arsenide substrate. The spacing between the metal films is substantially less than the diffusion length of a minority carrier in the indium arsenide at the operating temperature, which is on the order of –78° C. One metal film may be considered the collector region, the semiconductor material the base region, and the other metal film the emitter region. When the transistor is biased like an NPN transistor, the collector current is varied in proportion to the radiation striking the base region generally in the same manner as a photodiode, but the current modulation is many times that produced by a photodiode for a given radiation level.

12 Claims, 3 Drawing Figures

INVENTORS
MELVIN BELASCO
SEBASTIAN R. BORRELLO

E. Mickey Hubbard
ATTORNEY

SCHOTTKY BARRIER PHOTOTRANSISTOR

This application is a continuation of Ser. No. 652,653, filed July 5, 1967, now abandoned.

This invention relates generally to semiconductor devices, and more particularly to an improved phototransistor.

Various types of semiconductor photodiodes have been fabricated which produce current substantially in proportion to the quantum of light striking the sensitive region on either side of the diode junction. This type of structure is typically used for infrared detection, but the current produced must first be greatly amplified. Considerable effort has been directed toward an integrated circuit capable of both detecting the infrared energy and also amplifying the resulting current signal. Phototransistor structures have been proposed for this purpose. It was initially proposed to form the phototransistors by a pair of diffused junctions, or by a diffused junction and an alloyed junction. While these devices generally increase the current levels produced for a given photon level, the detectivity is not particularly high because of the high noise levels associated with the devices.

In copending application Ser. No. 626,651, entitled "Phototransistor and Process for Fabricating Same" filed on Jan. 25, 1967, in behalf of Borrello et al. by the assignee of the present application, and incorporated by reference herein, a phototransistor is described which utilizes one junction formed between a p-type diffused region and an n-type substrate and a second junction formed between a metal film and the p-type region, to form an improved and simplified phototransistor. That phototransistor device provides both detection and amplification, has a high current gain, produces negligible noise, has a low impedance, has a relatively high operating temperature which can be produced with dry ice, and is relatively easily fabricated when compared to previous processes. Although the device described in the above-named patent application greatly advances the phototransistor art, the present invention represents an even greater advance since the precise controls in maintaining the thickness have been greatly reduced. In addition, having two Schottky barrier rectifying junctions, the problem of controlling the doping level has been completely eliminated. This is of particular significance in reducing the repetitious steps involved in large scale production, especially in the use of III-V semiconductor compounds of great interest for infrared detection.

This invention is concerned with an improved phototransistor which is also much more easily and economically fabricated. The phototransistor is comprised simply of two closely spaced metal films in rectifying contact with one surface of a photosensitive semiconductor body. The gain of the transistor is related to the ratio of the minority carrier diffusion length in the semiconductor at the operating temperature to the spacing between the metal films.

The invention is also concerned with a method for fabricating a metal-semiconductor-metal transistor which comprises depositing a thin film of metal on a surface of a semiconductor body having a net acceptor impurity concentration at the surface sufficiently low to result in a rectifying junction, and then separating the film into two closely spaced, electrically isolated parts.

The novel features believed characteristic of this invention are set forth in the appended claims. The invention itself, however, as well as other objects and advantages thereof, may best be understood by reference to the following detailed description of illustrative embodiments, when read in conjunction with the accompanying drawing, wherein:

Figure 1:
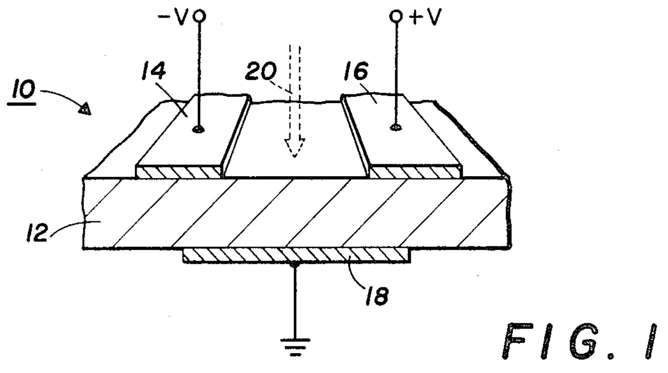
FIG. 1 is a cut-away perspective view of a phototransistor in accordance with the present invention.

Referring now to the drawing, a phototransistor constructed in accordance with the present invention is indicated generally by the reference numeral 10 in the cut-away perspective view of FIG. 1. The phototransistor 10 is comprised of a p-type semiconductor substrate 12 and a pair of metal films 14 and 16 in rectifying contact with the surface of the semiconductor body. For some applications, it may be desirable to provide a base contact 18, although for normal photo detection applications it is not necessary. The surface concentration of the semiconductor 12 is such that Schottky barriers are formed between the semiconductor and the metal films 14 and 16. The metal films 14 and 16 are identical and are, therefore, functionally interchangeable. The metal films 14 and 16 are preferably disposed as close together as fabrication technology permits. A spacing approaching 0.0001 inch is presently easily attainable using conventional photolithographic processes. The greater the spacing between the metal films, the lower the gain.

The p-type semiconductor material 12 is preferably indium arsenide (InAs), indium antimonide (InSb), gallium antimonide (GaSb), or gallium arsenide (GaAs). The other III–V compound semiconductors are also potential candidates for use as the semiconductor substrate, although those enumerated are especially commercially attractive at the present time. Also, III-V compound semiconductors such as indium-gallium arsenide ($In_xGa_{1-x}As$) may be used as the semiconductor material. The net acceptor surface concentration of the semiconductor used must be sufficiently low to produce efficient rectifying junctions between the metal films and the semiconductor. For example, the surface concentration of InAs, InSb, and GaSb should be less than about $1 \times 10^{17}$ atoms/cc and of GaAs and In-GaAs less than about $1 \times 10^{18}$ atoms/cc. The metal films 14 and 16 may be aluminum, gold, silver, molybdenum, chromium, nickel, and, generally, all high work function metals, so long as a rectifying junction is produced.

In operation, the phototransistor 10 is somewhat analogous to a conventional NPN transistor and is biased in the same manner. Thus, if the semiconductor material 12 is considered the base region, film 14 the emitter region, and film 16 the collector region, the emitter 14 would be biased negative with respect to the base, and the collector 16 would be biased positive with respect to the base, as shown in FIG. 1. The path of the minority carriers between the emitter 14 and the collector 16 extends through the semiconductor 12 parallel to the surface. When radiation of the wavelength to which the particular semiconductor material is sensitive penetrates the p-type base region 12 between the emitter 14 and collector 16, as represented by arrow 20, electron-hole pairs are generated within the base region. The holes have a long lifetime with respect to the electrons and tend to create a positive charge imbalance in the base region, which forward biases the emitter-base junction between film 14 and base region 12. Electrons in the emitter region are then injected into the base region and diffused toward, and are collected by, the reverse biased Schottky barrier formed between the collector 16 and base region 12. Since the emitter-base junction is forward biased, electrons are more easily injected into the base region when hole electron pairs are generated in the base region. In this way, several electrons may be injected into the base region and ultimately collected at the collector-base junction for every electron-hole pair generated by incoming photons, thus producing photo detector gain.

In general, the gain of the phototransistor 10 is dependent upon the base transport efficiency of the device, which is primarily dependent upon the ratio of the minority carrier diffusion length in the base region to the spacing between the emitter 14 and collector 16. Thus, the spacing between the emitter and collector contacts should be as close as technology permits, which, as mentioned, may easily be about 0.0001 inch using photo etching processes. Using this spacing, the semiconductor compounds mentioned above which have minority carrier diffusion lengths in the 100–300 micron range at temperatures around −78° C, have very high gain values.

Since the phototransistor 10 has no diffused junctions, the phototransistor may be operated at higher temperatures than phototransistors having a diffused junction when using p-type indium arsenide as the semiconductor because the Schottky barrier height of indium arsenide is greater than the band gap of indium arsenide by about 10 percent of the band gap. Therefore, the thermally generated currents, both electron and hole currents, will be smaller than for the diffused barrier. The smaller the thermal currents, the higher the emitter and collector efficiency at any given temperature, or conversely, the higher the temperature for the same efficiency.

Figure 2:
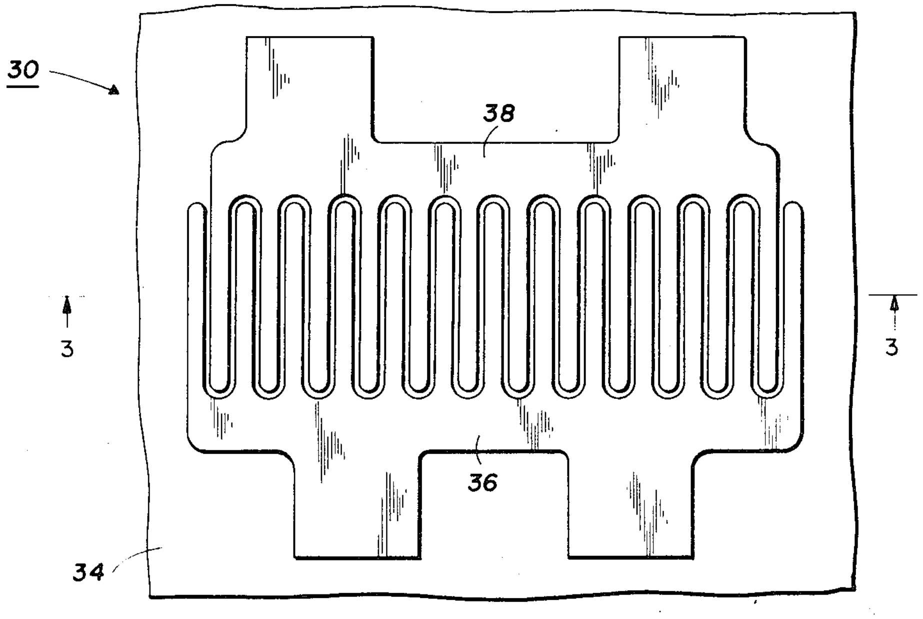
FIG. 2 is a somewhat simplified plan view of a phototransistor constructed in accordance with the present invention.
Figure 3:
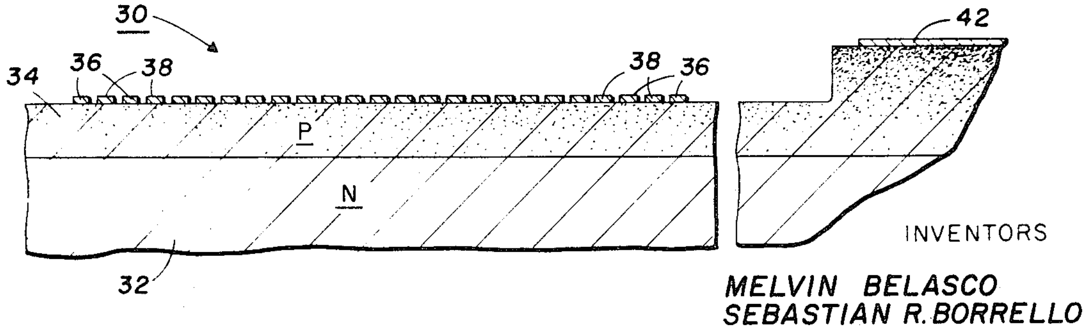
FIG. 3 is a sectional view taken substantially on lines 3—3 of FIG. 2.

Referring now to FIGS. 2–3, a phototransistor constructed in accordance with the present invention is indicated generally by the reference numeral 30. The phototransistor 30 is formed on an n-type indium arsenide substrate 32. A diffused p-type region 34 extends over the entire surface of the substrate. The diffused region 34 is necessary only because p-type indium arsenide having the desired impurity concentration is not presently commercially available, while n-type indium arsenide is commercially available. The net acceptor surface concentration of the p-type semiconductor region 34 should be somewhat less than about $1 \times 10^{17}$ atoms/cc, and preferably less than about $5 \times 10^{16}$ atoms/cc. Such a surface concentration can be produced by starting with an n-type indium arsenide substrate having an impurity concentration of from about $2 \times 10^{16}$ atoms/cc to about $4 \times 10^{16}$ atoms/cc and a resistivity on the order of about 0.1 ohm-centimeters. A p-type impurity is then diffused over the entire surface of the substrate. The impurity is preferably cadmium, although other suitable impurities, such as zinc and magnesium for example, may be used if desired. The diffused region may be produced by placing the substrate 32 within one end of an evacuated quartz capsule, and placing the impurity source, typically five spheres of 20 percent cadmium-80 percent indium alloy, within the other end of the capsule. The capsule is placed in a two-zone diffusion furnace so that the impurity source material is heated to about 600° C, and the semiconductor substrate is heated to about 650° C.

As a result of this diffusion process, the diffused region 34 typically has a surface concentration of about $8 \times 10^{16}$ atoms/cc, an error function profile, and a junction depth of about twenty microns. In order to get a surface concentration of about $5 \times 10^{16}$ atoms/cc, the surface of the slice may be etched using a semiconductor grade white etch, which is a solution containing three parts nitric acid ($HNO_3$) to one part hydrofluoric acid (HF). If the depth of the etch is about ten microns, the desired surface concentration will usually be achieved. However, it will be appreciated that the depth of the etch is not highly critical, since an excess depth will merely decrease the surface concentration, thus, in general, increasing the Schottky barrier effect between the semiconductor and the subsequently deposited metal film which will now be described.

Next, aluminum, or other suitable metal as mentioned above, is evaporated onto the surface of the substrate using conventional vacuum evaporation techniques. The substrate is heated to about 150° C during deposition. The aluminum layer is typically about 5,000 angstrom units thick. The aluminum layer is then patterned by conventional photolithographic techniques to form emitter and collector films 36 and 38, having interdigitated fingers as shown in FIG. 2. Spacing on the order of 0.0001 inch is attainable by this process. Since the impurity concentration at the surface of the p-type diffused region 34 is low, the aluminum layers 36 and 38 form rectifying junctions, commonly known as Schottky barriers, essentially at the interface between the aluminum and the indium arsenide semiconductor.

In the event it is desired to bias the base region 34, the surface of the diffused region can be masked during the white etch process with black wax to leave a surface 40 having a higher impurity concentration, as illustrated by the fragmented portion of FIG. 3. The surface 40 may then be plated with rhodium to form an expanded contact 42, and a gold wire (not illustrated) soldered to the rhodium plate using indium as the solder. However, for normal photo detection, the base contact 42 will not be used.

The metal film may also be separated into two electrically isolated parts by other methods without departing from the broader aspects of this invention. For example, the plate may be separated by a deflected beam of electrons or a deflected beam of photons from a laser in order to produce closer spacing between the two thin metal films than can be achieved using photolithographic processes.

The phototransistors 10 and 30 can also be operated as conventional transistors by applying voltages to their respective base contacts to produce the necessary base current. The base current supplied by this means can, of course, be of constant value, or can be a varying signal. In general, the group IV semiconductors, such as silicon and germanium, have minority carrier diffusion lengths that are so short as to provide relatively poor gain factors at the emitter-collector spacing attainable by current photolithographic technology. However, where a very low gain device is required, such semiconductor materials can be used.

Although preferred embodiments of the invention have been described in detail, it is to be understood that various changes, substitutions and alterations can be made therein without departing from the spirit and scope of the invention as defined by the appended claims.

What is claimed is:

1. A metal-semiconductor-metal phototransistor comprising in combination:

a. a photosensitive semiconductor body; and b. a pair of metal films selectively spaced on one major surface of said semiconductor body thereby exposing a selected area of said semiconductor body therebetween, said pair of metal films forming rectifying junctions with said semiconductor body; wherein c. the distance between said pair of metal films being selected so that the length of the current path through said semiconductor body between said pair of metal films is less than the minority carrier diffusion length in said semiconductor body at the operating temperature of said phototransistor; whereby d. when radiation of a selected wavelength impinges upon said exposed selected area, photo-current gain is produced.

2. The metal-semiconductor-metal phototransistor of claim 1 wherein said rectifying junctions between said pair of metal films and said semiconductor body are schottky barriers.

3. The metal-semiconductor-metal phototransistor of claim 1 wherein the gain thereof is proportional to the ratio of the minority carrier diffusion length in said semiconductor body at the operating temperature to the spacing between said pair of metal films.

4. The metal-semiconductor-metal phototransistor of claim 1 and further including a metal layer on the opposite major surface of said semiconductor body.

5. The metal-semiconductor-metal phototransistor of claim 1 wherein said semiconductor body is the base region thereof, and wherein said pair of metal films are respectively the emitter and collector regions thereof.

6. The metal-semiconductor-metal phototransistor of claim 1 wherein each of said pair of metal films have a plurality of spaced fingers formed along one edge thereof with the fingers on one of said metal films being interdigitated with the fingers on the other of said metal films, and wherein the spacing between adjacent fingers being said selected distance.

7. The metal-semiconductor-metal phototransistor of claim 1 wherein said semiconductor body is an N-type substrate of indium arsenide having a P-type doped region formed in one surface thereof to provide said one major surface.

8. The metal-semiconductor-metal phototransistor of claim 1 wherein said semiconductor body is a III–V compound semiconductor.

9. The metal-semiconductor-metal phototransistor of claim 1 wherein said semiconductor body is taken from the group consisting of indium arsenide (InAs), indium antimonide (InSb), gallium antimonide (GaSb), gallium arsenide (GaAs), and indium-gallium arsenide ($In_xGa_{1-Bx}As$).

10. The metal-semiconductor-metal phototransistor of claim 1 wherein said semiconductor body has a p-type surface with a net acceptor surface concentration of less than about $1 \times 10^{17}$ atoms/cc.

11. The metal-semiconductor-metal phototransistor of claim 1 wherein said semiconductor body has a p-type surface with a net acceptor concentration of less than about $1 \times 10^{18}$ atoms/cc.

12. The metal-semiconductor-metal phototransistor of claim 1 wherein said semiconductor body has a p-type surface with a net acceptor surface concentration of less than about $5 \times 10^{16}$ atoms/cc.

* * * * *